United States Patent [19]

Kim et al.

[11] Patent Number: 5,124,765
[45] Date of Patent: Jun. 23, 1992

[54] HIGHLY INTEGRATED SEMICONDUCTOR MEMORY DEVICE WITH TRENCH CAPACITORS AND STACKED CAPACITORS

[75] Inventors: Seong-tae Kim; Kyung-hun Kim; Jae-hong Ko; Su-han Choi, all of Seoul, Rep. of Korea

[73] Assignee: Samsung Electronics Co., Ltd., Kyunggi, Rep. of Korea

[21] Appl. No.: 637,558

[22] Filed: Jan. 4, 1991

[30] Foreign Application Priority Data

Aug. 14, 1990 [KR] Rep. of Korea .................. 90-12555

[51] Int. Cl.$^5$ .................. H01L 29/68; H01L 27/02; H01L 29/06
[52] U.S. Cl. .................. 357/23.6; 357/51; 357/55
[58] Field of Search .................. 357/23.6, 33.6 G, 55; 437/52

[56] References Cited

U.S. PATENT DOCUMENTS 4,974,040 11/1990 Taguchi et al. .................. 357/23.6

FOREIGN PATENT DOCUMENTS

62-137863 6/1987 Japan .................. 357/23.6 G

Primary Examiner—Rolf Hille
Assistant Examiner—Robert P. Limanek
Attorney, Agent, or Firm—Cushman, Darby & Cushman

[57] ABSTRACT

A highly integrated semiconductor memory device comprises a plurality of memory cells formed by alternately disposing a stack-type capacitor cell and a combined stack-trench type capacitor cell both in row and column directions. Each storage electrode of the capacitor of the memory cell is extended to overlap with the storage electrode of the capacitor of the adjacent memory cell. The combined stack-trench type capacitor is formed into the substrate to increase the storage capacitance thereof which allow the storage capacitance of the stack-type capacitor to increase by extending the storage electrode of the capacitor. Due to the alternate arrangement of stack-trench type capacitor and stack-type capacitor, step coverage, leakage current and soft errors of stack-trench type capacitor are prevented.

3 Claims, 12 Drawing Sheets

HIGHLY INTEGRATED SEMICONDUCTOR MEMORY DEVICE WITH TRENCH CAPACITORS AND STACKED CAPACITORS

FIELD OF THE INVENTION

The present invention relates to a semiconductor memory device and a manufacturing method thereof, and more particularly, to a highly integrated semiconductor memory device and a manufacturing method thereof wherein the effective area of a capacitor is maximized without expanding the memory cell areas.

BACKGROUND OF THE INVENTION

In the fields of the semiconductor memory techniques, competitive efforts have been carried out to increase the number of memory cells in a chip. In order to achieve the object, it is important to minimize the area of a memory cell array, on which a plurality of memory cells are formed within a restricted surface of a chip.

In realizing the minimum area of the memory cell, a DRAM (Dynamic Random Access Memory) in which an individual cell has a single transistor and a single capacitor is well known. Since a large portion of the area is occupied by the capacitor in the above-mentioned memory cell, with the development of higher packing density of the highly integrated semiconductor memory device, it becomes more important to increase the capacitance of the capacitor along with minimizing the ratio of the semiconductor area occupied by the capacitor, so as to facilitate the information detection and to decrease the soft errors resulting from alpha particles.

In order to minimize the area occupied by a capacitor and maximize the capacitance of a storage capacitor as described above, a spread stacked capacitor (to be called hereinafter SSC) cell structure, in which a storage electrode of each memory cell is expanded to the adjacent memory cell area, has been proposed. Such a conventional memory cell having the SSC cell structure was disclosed in pages 31 to 34 of IEDM 89.

In the prior art mentioned above, a first electrode of the capacitor expands to areas of adjacent memory cells by exposing the source region of each memory cell on a semiconductor silicon substrate in which transistors are formed. A 64Mbit DRAM can be achieved in the aforesaid structure of the SSC cell.

However, the prior art SSC cells structure is unable to obtain sufficient capacitive storage area required for a 256Mbit DRAM. The size of each first capacitor of the first memory cells is restricted by the size of each second capacitor of the second memory cells because the first capacitor is formed between the second capacitors. As a result, the size of the second capacitors are restricted to maintain balance with the size of the first capacitor. Accordingly, the second capacitors of the second memory cells can not fully expand to maximumly overlap the first capacitor of the first memory cells. Preferably, the size of the first capacitor should be enlarged to the size of the second capacitors, and the second capacitors of the second memory cells should be fully expanded to the first capacitor of the adjacent first memory cells. However, because the size of the first capacitor of the first memory cells is restricted by the second capacitor of the second memory cells in the conventional SSC cell structure, it is insufficient to obtain the effective area of the capacitor required for the 256 Mbit DRAM, wherein the cell size is smaller than that of the 64 Mbit DRAM.

SUMMARY OF THE INVENTION

Therefore, it is an object of the present invention to provide a DRAM, wherein, to solve the above described problems of the conventional techniques, a memory cell array is formed by alternately disposing a stack-type capacitor cell and a combined stack-trench type capacitor cell adjacent to each other.

It is another object of the present invention to provide a manufacturing method which effectively manufactures the DRAM having the above mentioned structure.

To achieve these objects, the memory cell array of the DRAM according to the present invention is constructed as follows. A plurality of memory cells, each of which has a switching transistor, are formed on a semiconductor substrate and stack-type capacitors are stacked on the switching transistor. The storage electrode of each stack-type capacitor of first memory cells is expanded to the areas of second memory cells disposed adjacently to the first memory cells and the storage electrode of each stack-type capacitor of the second memory cells is expanded to the areas of the adjacent first memory cells. As a result, the expanded storage electrodes of the stack-type capacitors of the first and second memory cells partly overlap.

Each capacitor of the first memory cells includes a stack-type capacitor and a trench-type capacitor formed in a source region of the switching transistor and in the semiconductor substrate, respectively, in such a manner that the first and second memory cells are disposed alternately and adjacently to one another in both the row and column direction.

The present method for manufacturing the memory cell array having the aforesaid structure comprises a first process which defines active regions by growing field oxide layers on a first conductivity type semiconductor substrate. A second process forms transistors on the active regions, and a first insulating layer over the resultant structure. A third process forms bit lines to connect to each drain region of the transistors, and a second insulating layer over the resultant structure. A fourth process forms first openings, which expose predetermined portions of the source regions, to provide first memory cells having the combined stack-trench type capacitor. A fifth process forms trenches in the semiconductor substrate by using the first openings. A sixth process forms a capacitor on both the inside surface of the trench and the second insulating layer, and then, forms a third insulating layer on the resultant structure. A seventh process forms second openings by exposing the source regions of the transistors adjacent to the first memory cells in the row or column direction. Finally, an eighth process forms a stack type capacitor through the second opening.

BRIEF DESCRIPTION OF THE DRAWINGS

The present invention will be described by way of embodiments with reference to the attached drawings, in which.

DETAILED DESCRIPTION OF THE PREFERRED EMBODIMENT

Figure 1:
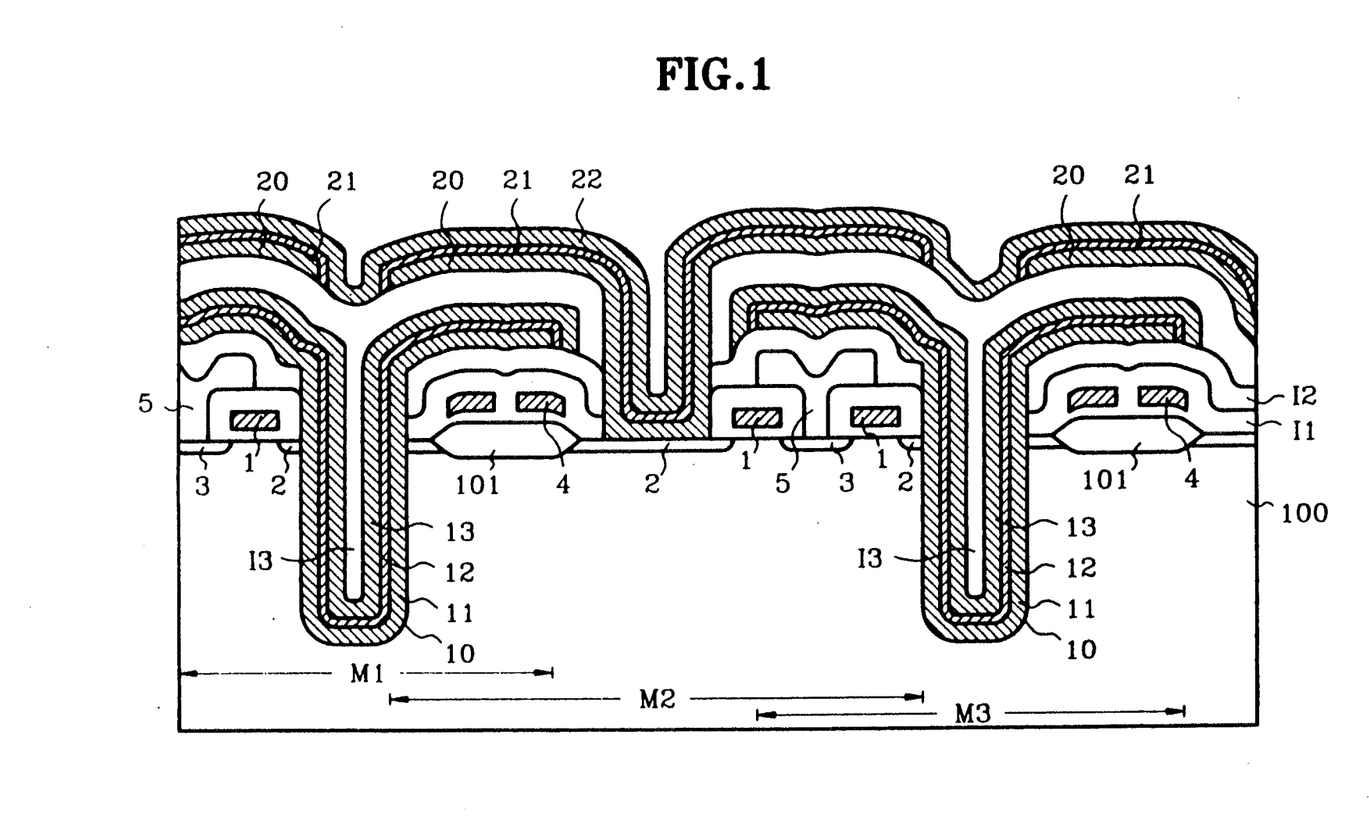
FIG. 1 is a sectional view of the memory cell according to the present invention.

In the memory cell array of the present invention, as shown in FIG. 1, memory cells M1 and M3 including combined stack-trench type capacitors 11, 12 and 13 are disposed alternately and adjacently to a memory cell M2 having a stack-type capacitor 20, 21 and 22. The storage electrodes 11 (the first electrodes of the capacitors) of the first and the third memory cells M1 and M3 are expanded to the adjacent second memory cell area, and a storage electrode 20 of the second memory cell M2 is expanded to the areas of the first and the third memory cells M1 and M3. Although the memory cell array in FIG. 1 illustrates the memory cells disposed adjacently in a row direction, the memory cell array also has memory cells with the combined stack-trench type (or trench-type) capacitor disposed adjacently to memory cells with the stack type capacitor in the column direction.

FIGS. 2A to 2G illustrate one embodiment of the processes for manufacturing a memory cell array according to the present invention.

Figure 2A:
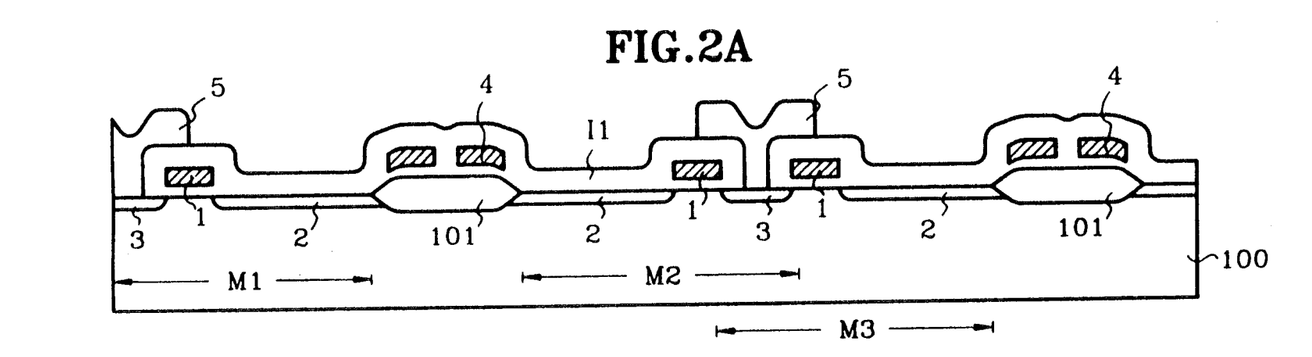
FIGS. 2A to 2G show one embodiment of the processes for manufacturing the memory cell array according to the present invention.

FIG. 2A illustrates the process for forming transistors and bit lines 5 on a semiconductor substrate 100, wherein active regions are first defined by growing via selective oxidation field oxide layers 101 in a first conductivity type semiconductor substrate 100. Gate electrodes 1 (an impurity doped first polycrystalline silicon layer are formed on the active regions by interposing gate oxide layers and, at the same time, first conductive layers 4 of the transistors (also an impurity-doped first polycrystalline silicon layer) are formed on any predetermined portions of the field oxide layers 101 such that the first conductive layers 4 are connected to the gate electrodes of the memory cell disposed adjacently to the field oxide layers 101. Source regions 2 and drain regions 3 are formed by ion implantation in the surface of the semiconductor substrate on each side of the gate electrodes 1. Then, a first insulating layer I1, e.g., HTO (High Temperature Oxide) layer or LTO (Low Temperature Oxide) layer having a thickness of about 500Å~2000Å, is formed over the entire surface of the structure. Metal layers 5, serving as bit lines, are formed after exposing some portions of the drain regions 3. Here, the structure of FIG. 2A includes the first, second and third memory cells M1, M2 and M3.

Figure 2B:
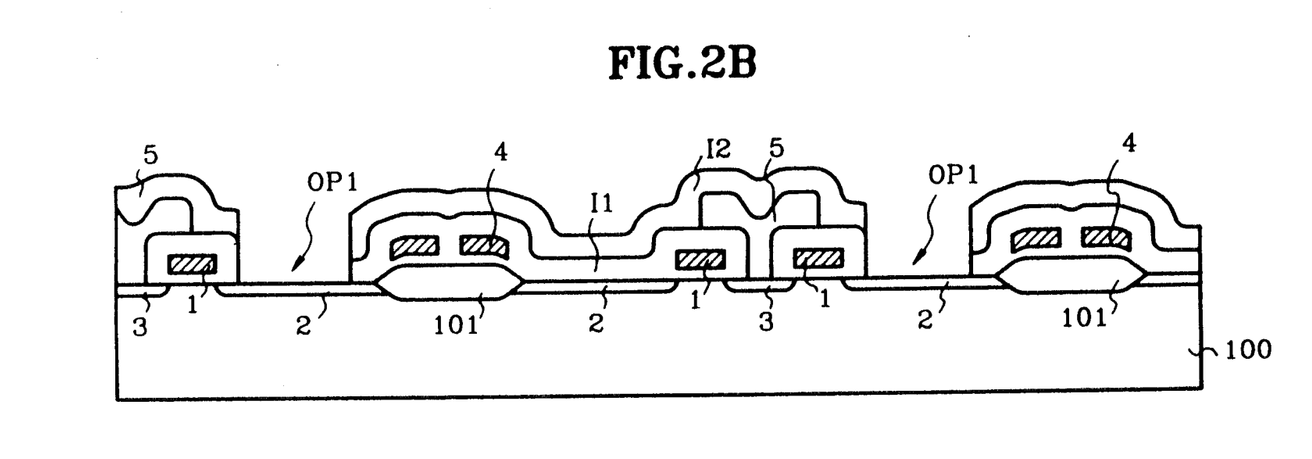

FIG. 2B illustrates the formation of a second insulating layer I2 and first openings OP1. The second insulating layer I2 (e.g., an HTO layer) is deposited at a thickness of about 500Å~3000Å. Then by using a mask pattern on the second insulating layer I2, the first openings OP1 are formed to expose the source regions 2 of the first and third memory cells M1 and M3.

Figure 2C:
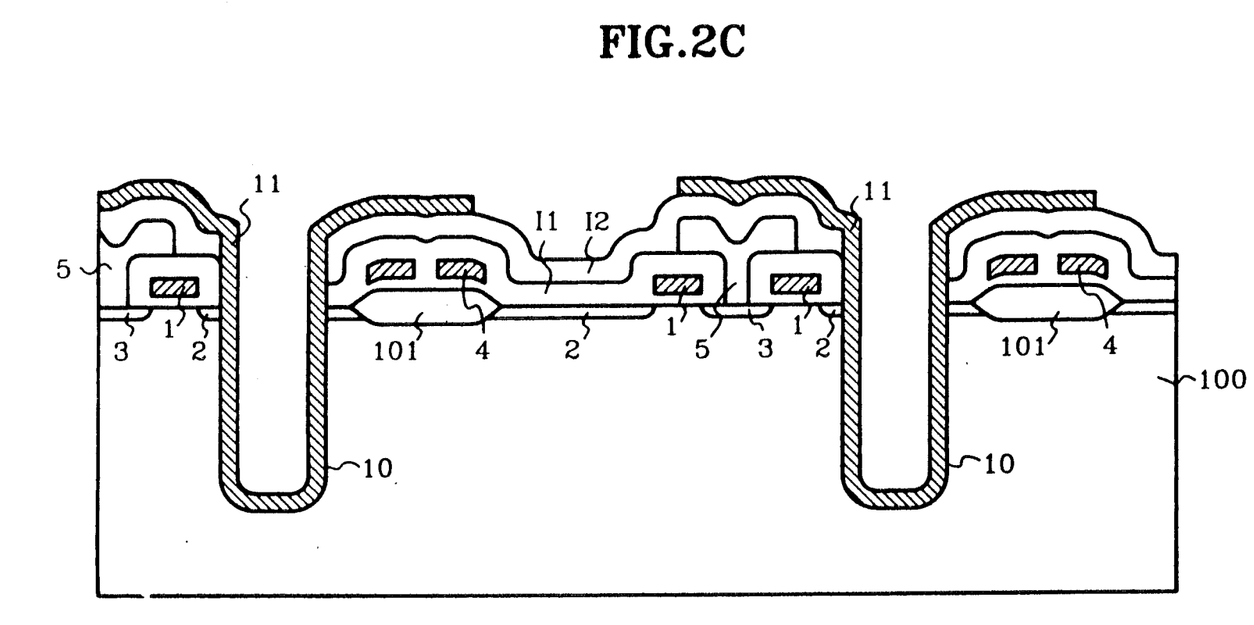

FIG. 2C illustrates the process for forming trenches 10 and second conductive layers 11. Through the first openings OP1, the semiconductor substrate 100 is etched to form the trenches 10. The second conductive layers 11 (e.g., an impurity-doped second polycrystalline silicon layer), which serve as the first or storage electrodes of the capacitors, are deposited with a thickness of about 200Å~3000Å both on the walls of the trenches 10 and on the second insulating layers I2, thereby forming an electrode pattern as shown in FIG. 2C. Here, the depth of the trench 10 can be adjusted in the range of approximately 0.5 μm~10 μm, in accordance with the intended value of the capacitance.

Figure 2D:
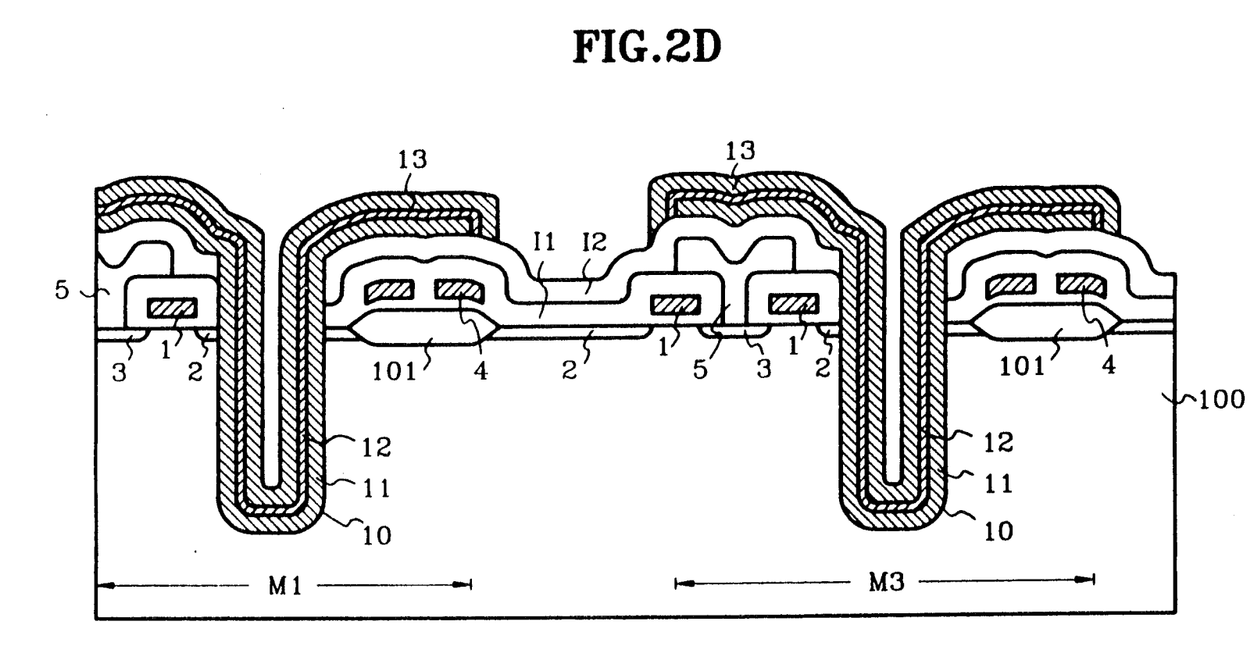

FIG. 2D illustrates the process for forming dielectric films 12 and third conductive layers 13. The dielectric films 12 and the third conductive layers 13, having a thickness of about 500Å~4000Å, are successively formed, whereby the first memory cells M1 and M3 having the combined stack-trench type capacitors are completed. The dielectric film 12 is an oxide layer structure, such as an HTO layer, an LTO layer, an oxide/nitride/oxide (ONO) structure, or a nitride/oxide (NO) structure. In addition, instead of the combined stack-trench (or trench-type) capacitor, an outside trench-type capacitor, in which the charge is stored in the outside region of the trench in the semiconductor substrate, can be formed.

Figure 2E:
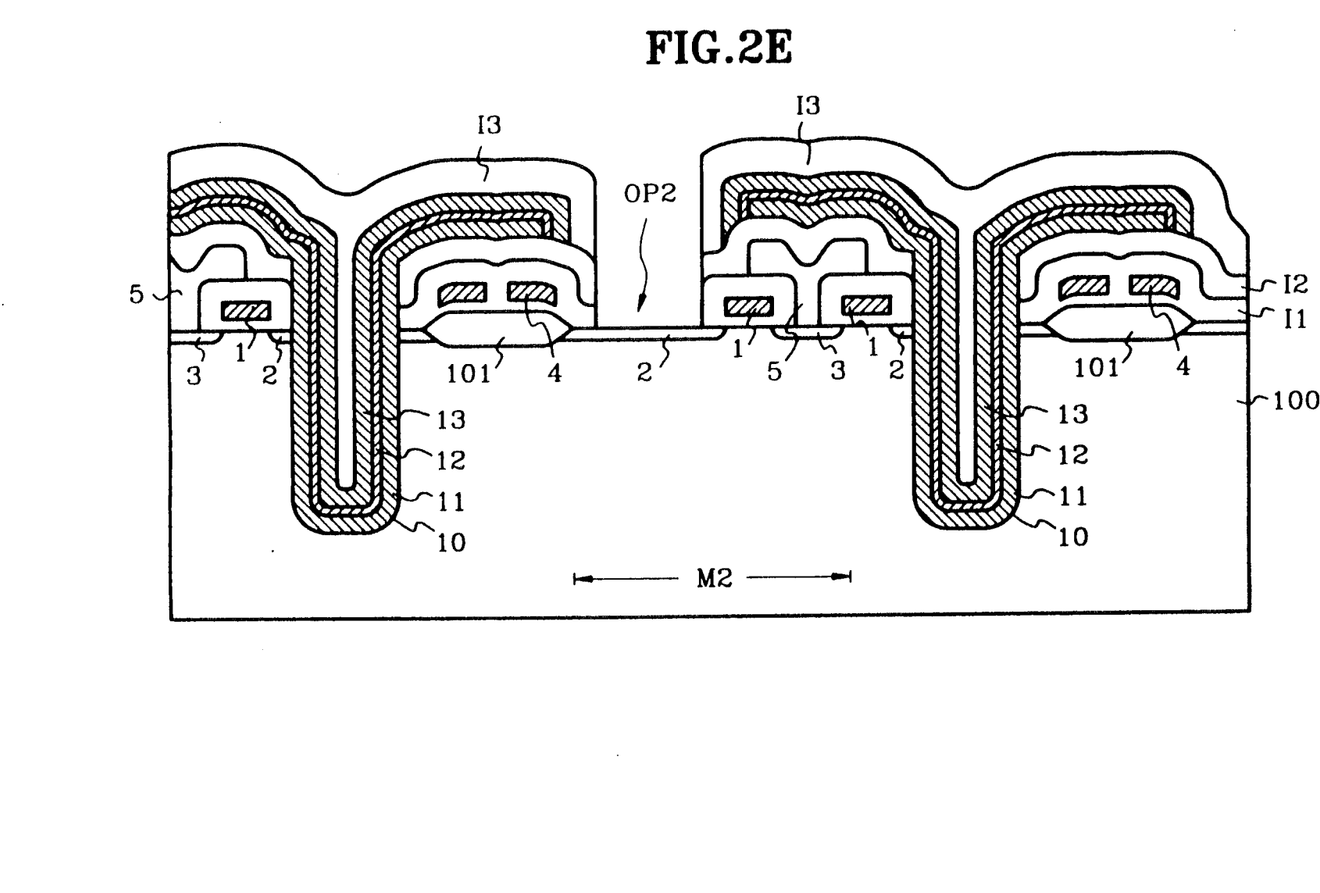

FIG. 2E illustrates the process for forming third insulating layers I3 and a second opening OP2. After the process shown in FIG. 2D, the third insulating layer I3 (e.g., an HTO layer), having a thickness of about 500Å~3000Å, is deposited, and then, the second opening OP2 is formed to expose the source region 2 of the second memory cell M2. Here, after depositing a BPSG (Boro-Phosphorus Silicate Glass) layer having a thickness of about 500Å~4000Å, the third insulating layer can be formed by planarizing via reflow process.

Figure 2F:
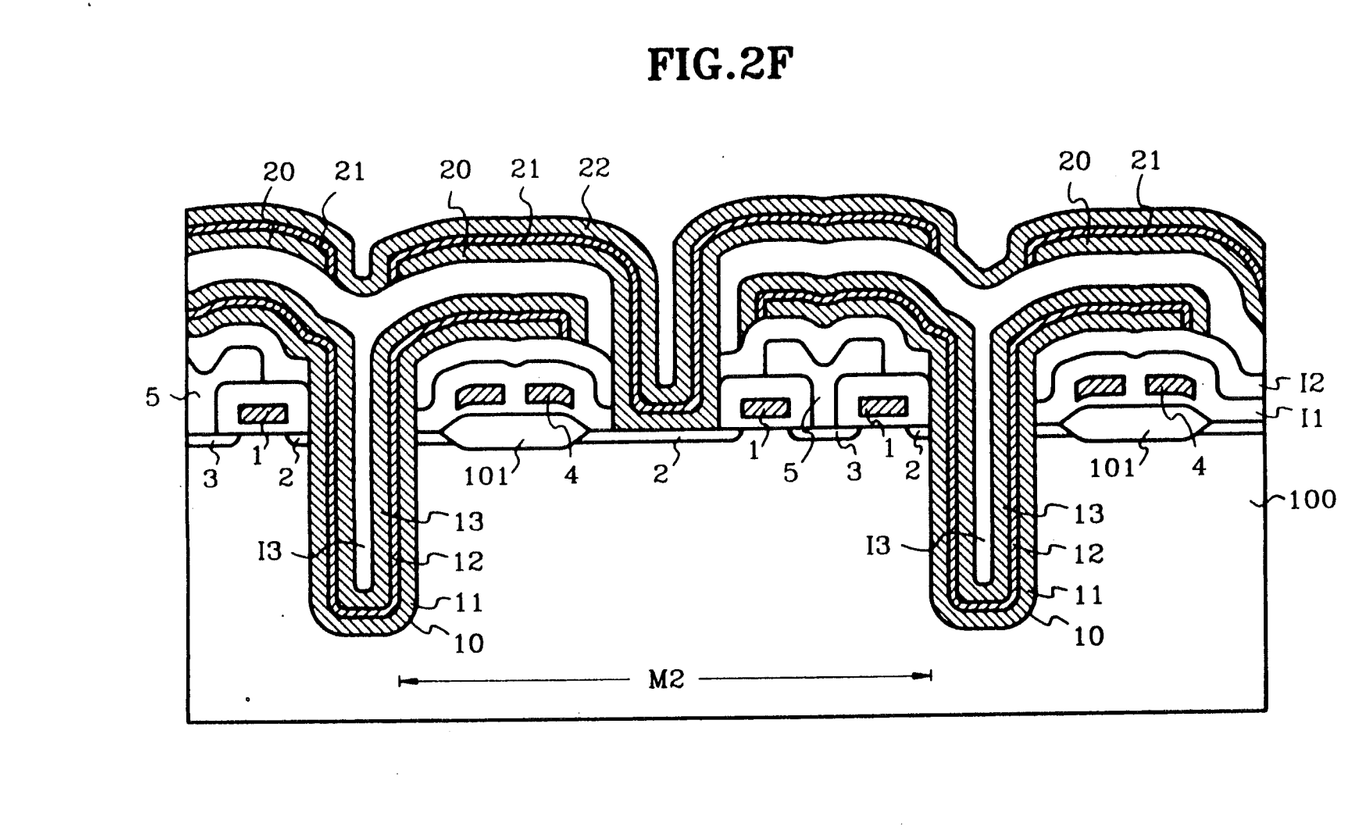

FIG. 2F illustrates the process for forming a fourth conductive layer 20, which serves as a first electrode of a capacitor, a dielectric film 21, and a fifth conductive layer 22. After performing the process shown in FIG. 2E, the fourth conductive layer 20 (e.g., an impurity-doped fourth polycrystalline silicon layer), which serves as the first electrode of the capacitor, is deposited to a thickness of about 300Å~4000Å to form the electrode pattern illustrated in FIG. 2F. Thereafter, the dielectric film 21 and the fifth conductive layer 22, which serve as the second electrode of the capacitor, are successively formed to a thickness of about 500Å~4000Å over the fourth conductive layer 20, thereby completing the second memory cell M2 having the stack-type capacitor. Here, the dielectric film 21 is an oxide layer structure, such as an HTO layer, an LTO layer, an ONO structure, or an NO structure.

Figure 2G:
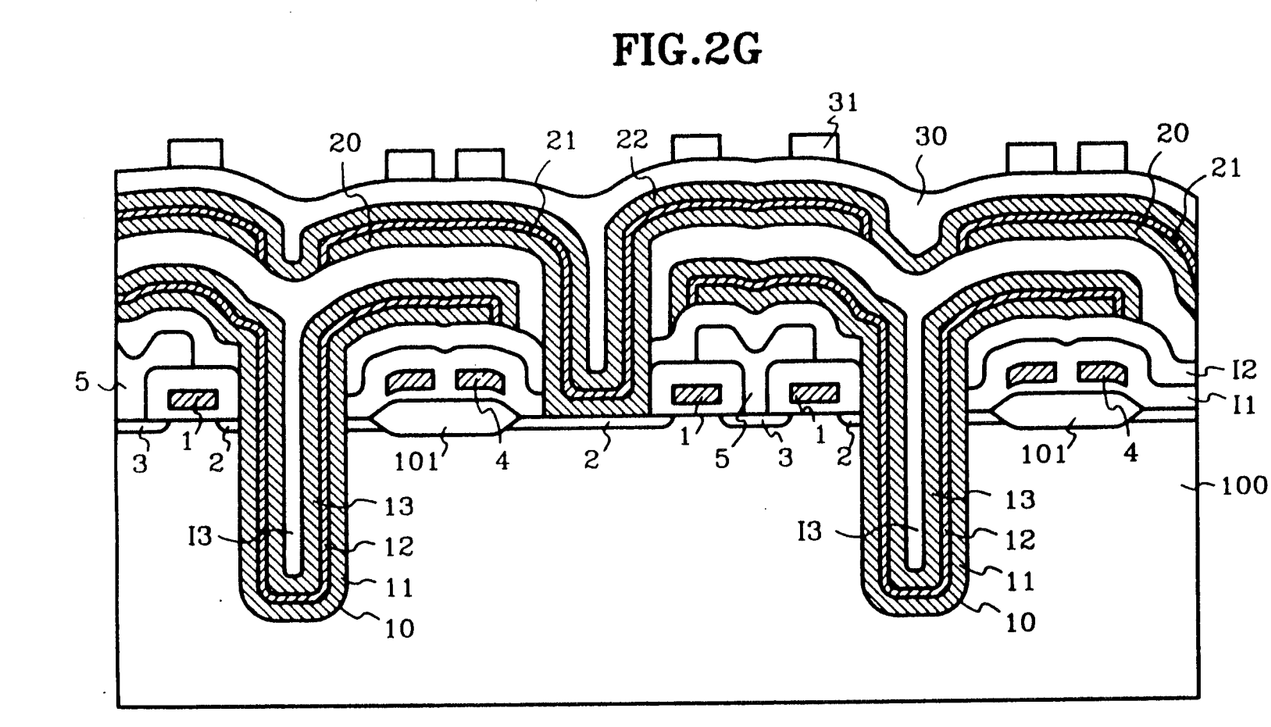

FIG. 2G illustrates the process for forming a planarizing layer 30 and metal electrodes 31. After the process shown in FIG. 2F, the planarizing layer 30, (e.g., a BPSG layer) is deposited for planarizing, and then, the metal electrodes 31 are formed, thereby completing the DRAM having both stack-trench type (or trench-type) capacitor cells and stack-type capacitor cells.

FIGS. 3A to 3E show another embodiment of the processes for manufacturing memory cell array according to the present invention.

Figure 3A:
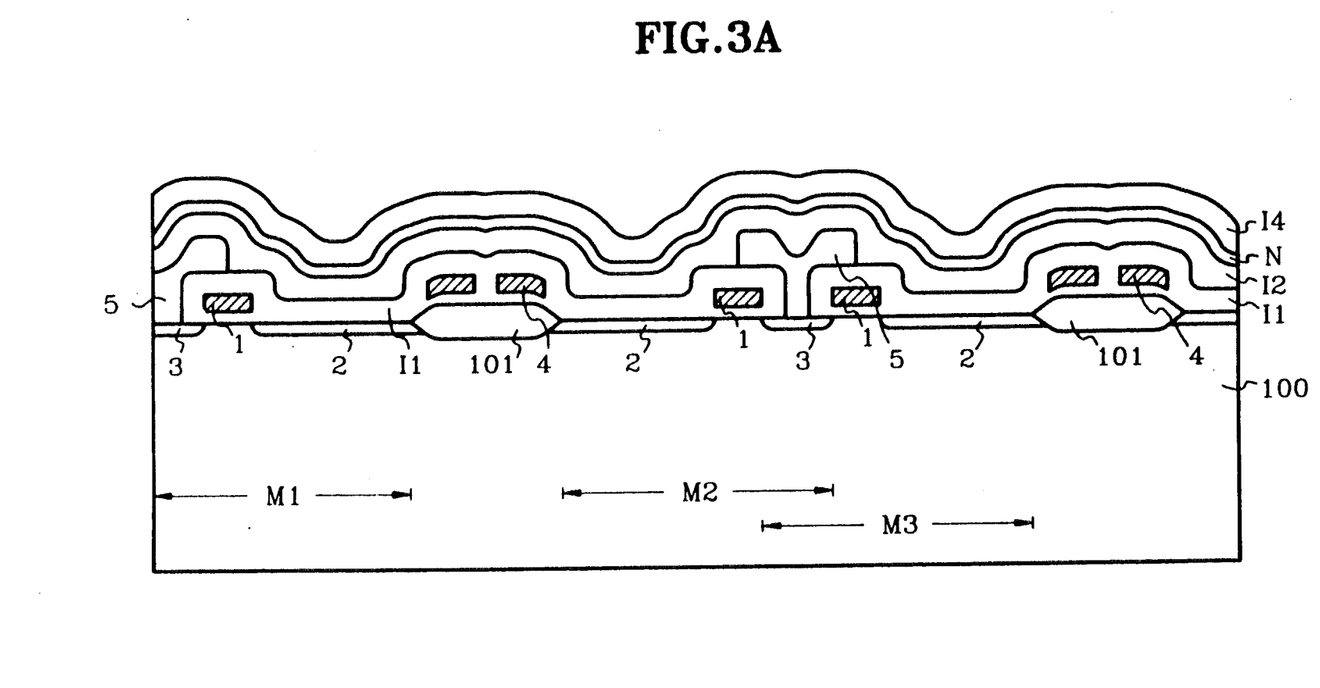
FIGS. 3A to 3E show another embodiment of the processes for manufacturing the memory cell array according to the present invention.

The manufacturing process preceding the process of FIG. 3A is identical to that described in relation to FIG. 2A, and thus is omitted.

FIG. 3A illustrates the process for forming a second insulating layer I2, a nitride layer N, and a fourth insulating layer I4. After the process illustrated in FIG. 2A, the second insulating layer I2 (e.g., an HTO layer), having a thickness of about 500Å~3000Å, the nitride layer N, having a thickness of about 100Å~500Å, and the fourth insulating layer I4 (e.g., an HTO layer), having a thickness of about 500Å~4000Å, are sequentially formed.

Figure 3B:
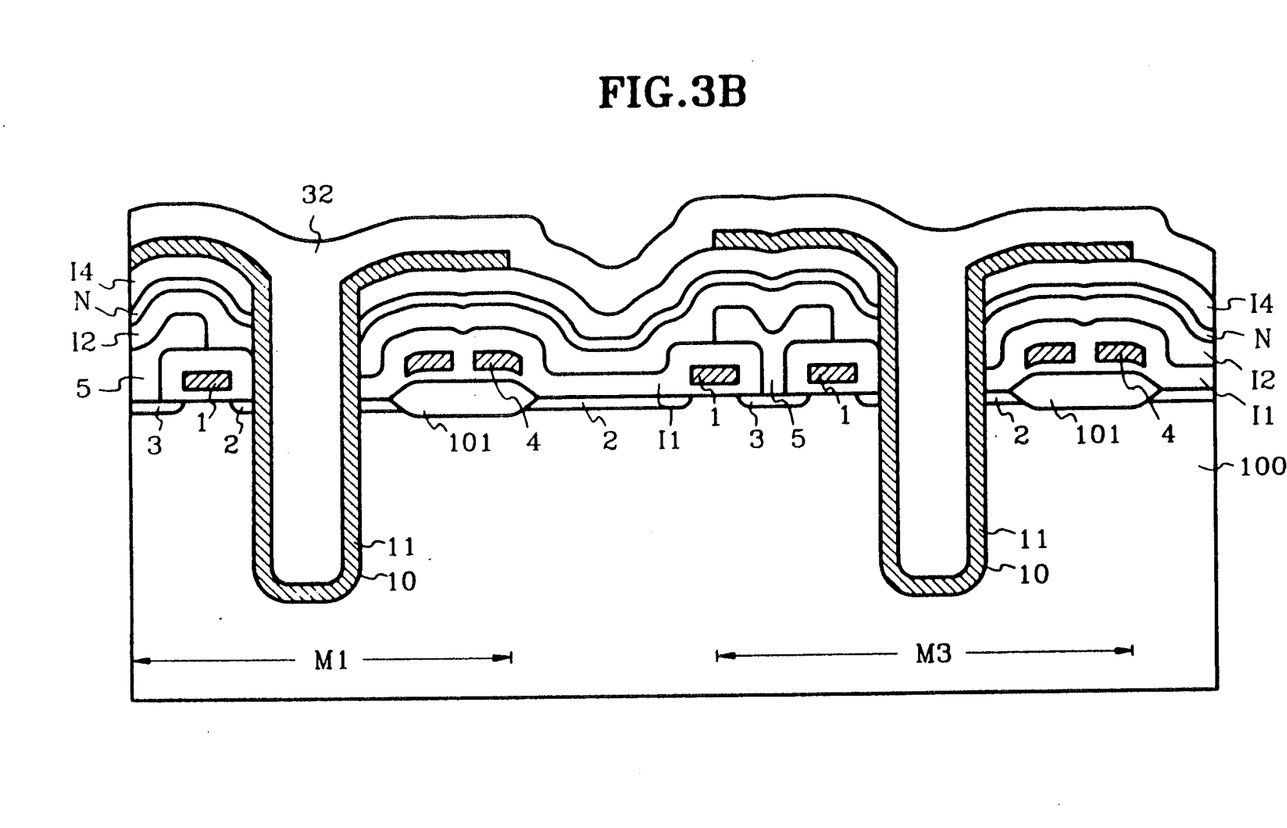

FIG. 3B illustrates the process for forming second conductive layers 11 and an inter-planarizing layer 32. By applying a mask pattern on the fourth insulating layer 14, first openings are formed to expose source regions 2 of the first and the third memory cells M1 and M3. The semiconductor substrate is etched to form trenches 10 through the first openings and, thereafter, second conductive layers 11 (e.g., an impurity-doped second polycrystalline silicon layer), which serve as the first electrodes of the capacitors, are deposited to a thickness of about 200Å~3000Å to form the electrode pattern as shown in FIG. 3B. The inter-planarizing layer 32 (e.g., SOG (spin on glass) layer), is deposited to planarize. During the process, the inter-planarizing layer 32 may be formed of a layer stacked by an SOG layer and an HTO layer or a layer stacked by a BPSG layer. Here, the depth of the trench 10 can be adjusted in the range of about 0.5 $\mu m$~10 $\mu m$, in accordance with the desired value of the capacitance.

Figure 3C:
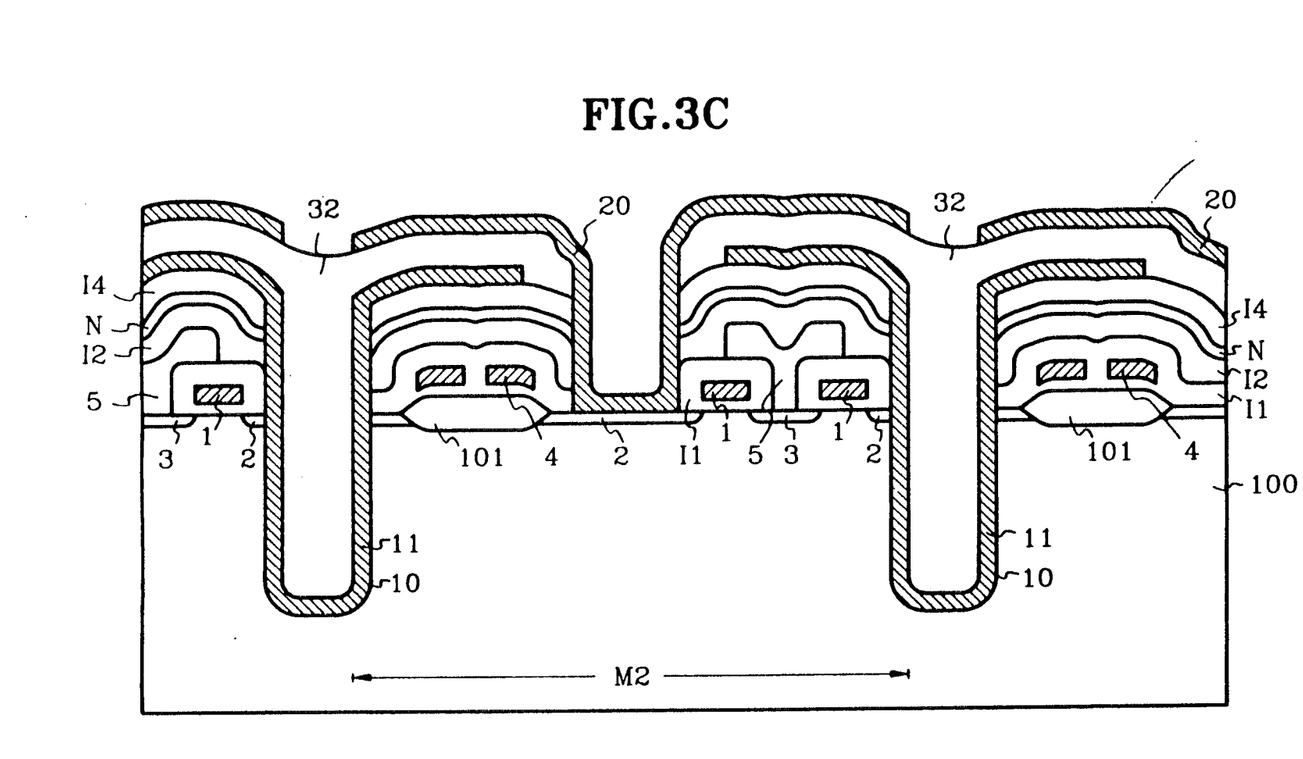

FIG. 3C illustrates the process for forming a second opening and a fourth conductive layer 20. After forming the inter-planarizing layer 32, the second opening is formed to expose the source region 2 of the second memory cell M2. Thereafter, the fourth conductive layer 20 (e.g., an impurity-doped fourth polycrystalline silicon), which functions as the first electrode of the capacitor, is deposited to a thickness of about 300Å~4000Å both on the surface of the second opening and on the inter-planarizing layer 32, to form the electrode pattern shown in FIG. 3C.

Figure 3D:
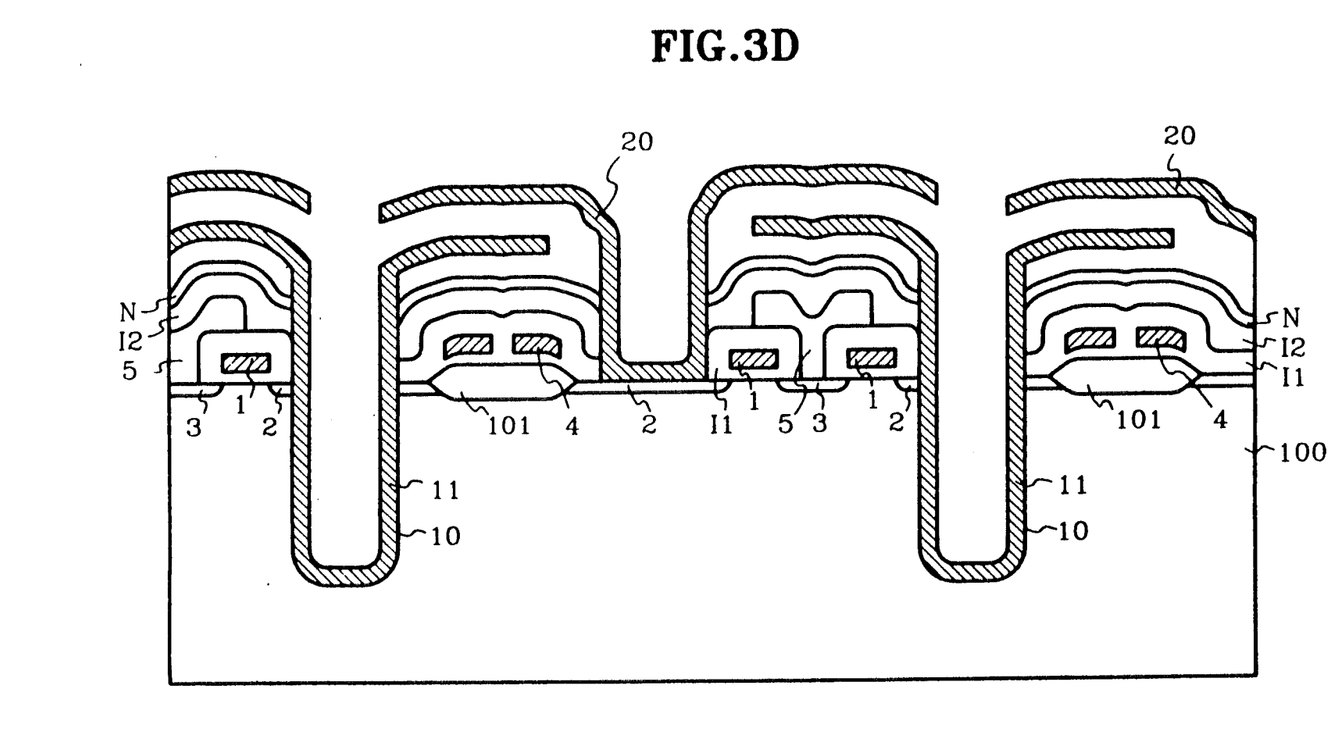

FIG. 3D illustrates the process for removing the fourth insulating layer and the inter-planarizing layer. By using the nitride layer N as a etch blocking layer, the fourth insulating layer and the inter-planarizing layer, which are disposed between the second conductive layer 11 and the fourth conductive layer 20, are removed by wet etching. As a result, the surface area of the first electrode pattern of each memory cell is considerably increased.

Figure 3E:
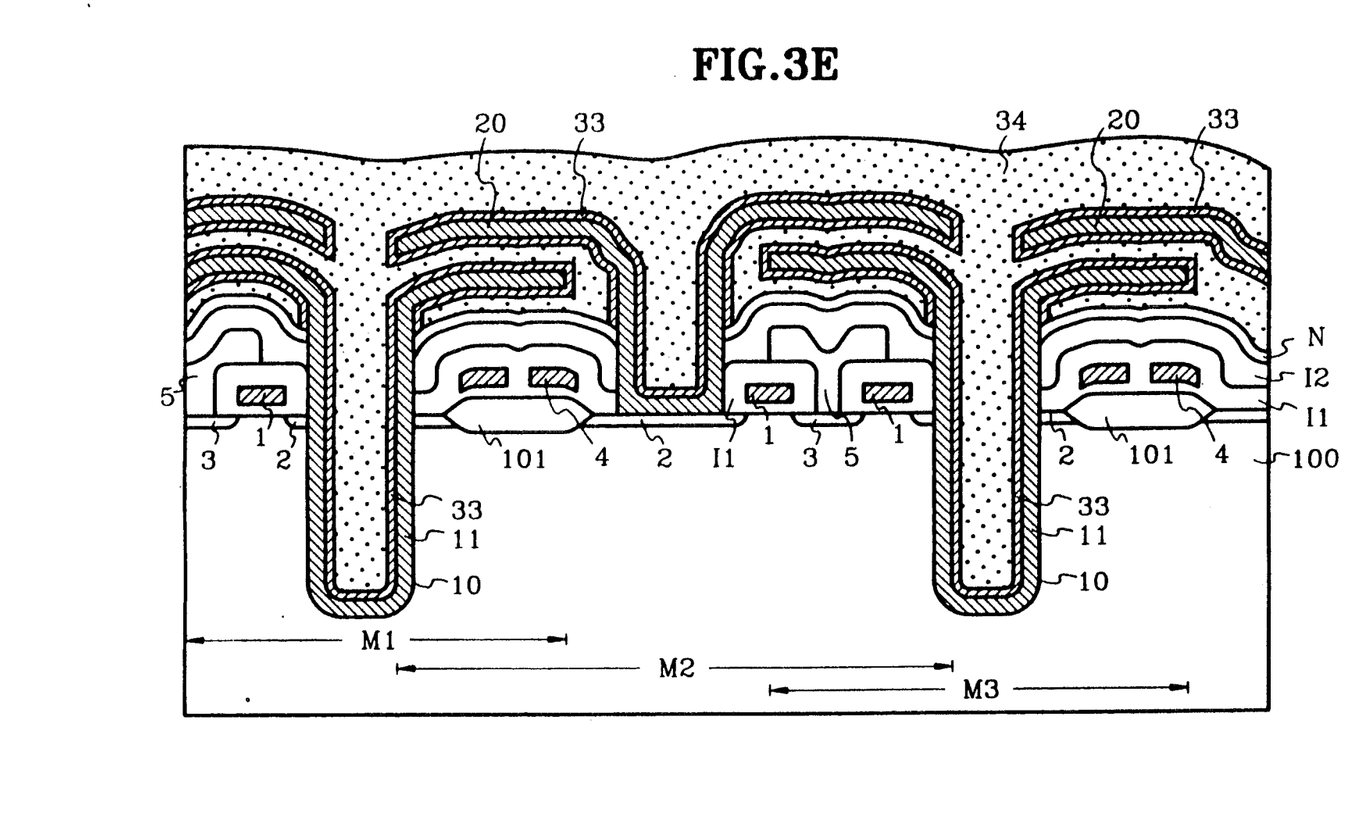

FIG. 3E illustrates the process for forming a dielectric film 33 and a sixth conductive layer 34. After the process shown in FIG. 3D, the dielectric film 33 is simultaneously formed on both the second conductive layer 11 and the fourth conductive layer 20. Then, the sixth conductive layer 34, (e.g., an impurity-doped sixth polycrystalline silicon layer), which serves as the second electrode of the capacitor, is deposited to a thickness of about 500Å~5000Å. This process completes the first memory cells M1 and M3 and the second memory cell M2. Here, the dielectric film 33 is an oxide layer structure or an ONO structure, such as an HTO layer or an LTO layer.

After performing the process illustrated in FIG. 3E, the planarizing layer (e.g., a BPSG layer) is deposited to effect the planarizing. Then, metal electrodes are formed to complete the DRAM having both the stack-trench type capacitor cells and the stack-type capacitor cells.

As described above, the capacitor according to the present invention uses a combined stack-trench type capacitor as the first capacitor of the conventional SSC structure, and a stack-type capacitor as the second capacitor of the conventional SSC structure. Accordingly, in manufacturing the combined stack-trench type (or trench-type) capacitor, sufficient storage area of each capacitor can be obtained without being restricted by the distance between the second capacitors, i.e., the stack-type capacitors. In addition, during the formation of the second capacitor (stack-type capacitor), the first capacitor, i.e., the combined stack-trench type (trench-type) capacitor, can markedly decrease the step coverage problem compared with the conventional first capacitor, i.e., stack-type capacitor, so that the processes are easily performed.

Furthermore, in the memory cell array of the present invention, because the first memory cells having combined stack-trench type (or trench-type) capacitors and the second memory cells having the stack-type capacitors are arranged adjacently to one another both in the row and column direction, memory cells having the trench are alternately formed. As a result, it is advantageous in that the leakage current between memory cells with trench and the soft errors resulting from alpha particles can be removed.

Moreover, by etching the oxide layer and the inter-planarizing layer in the second embodiment of the present invention, the areas of the upper portion, the side portion as well as the bottom portion of the first conductive layer are utilized as the first electrode of the capacitor, so that the storage area of the capacitor is maximized. Therefore, the decrease of the capacitance caused by the increase of the packing density of the highly integrated semiconductor memory device, can be improved by means of structural approach.

What is claimed is:

1. A highly integrated semiconductor memory device comprising:

first and second pluralities of memory cells, each memory cell in said first plurality of memory cells including a first switching transistor formed on a semiconductor substrate and a first capacitor coupled to said first switching transistor, each memory cell in said second plurality of memory cells including a second switching transistor formed on a semiconductor substrate and a second capacitor coupled to said second switching transistor, and each of said first and second memory cells alternately disposed in each of a plurality of rows, each first capacitor in each memory cell of said first plurality of memory cells further comprising:

a first storage electrode including a trench portion formed partially in said substrate and a first stack portion overlapping a portion of said adjacent second memory cell; and each second capacitor in each memory cell of said second plurality of memory cells further comprising:

a second storage electrode including only a second stack portion overlapping a portion of said adjacent first memory cell and not including a trench portion formed partially in said substrate.

2. A highly integrated semiconductor memory device as claimed in claim 1, wherein said first plurality of memory cells and said second plurality of memory cells are disposed alternately and adjacently both in each of said plurality of rows and in a column direction.

3. A highly integrated semiconductor memory device as claimed in claim 1, wherein said trench portion formed partially in said substrate of each first capacitor has a depth in the range of about 0.5 $\mu m$~10 $\mu m$.

* * * * *